United States Patent [19]

Phillips et al.

[11] Patent Number: 4,742,477

[45] Date of Patent: May 3, 1988

[54] COMPUTER TERMINAL CONTROLLER AND METHOD

[75] Inventors: Darwin E. Phillips; Robert M. DuRoss; Walter J. Conroy, all of Huntsville; Joseph T. Betterton, Jr., Arab; Alfred H. Glover, Decatur, all of Ala.

[73] Assignee: SCI Systems, Inc., Huntsville, Ala.

[21] Appl. No.: 642,438

[22] Filed: Aug. 20, 1984

[51] Int. Cl.$^4$ .......................... G06F 1/00; H02B 1/00; H05K 1/14; H05K 7/08

[52] U.S. Cl. ................................ 364/708; 361/380; 361/395; 361/400

[58] Field of Search ........ 364/708; 361/380, 392–395, 361/397, 400

[56] References Cited

U.S. PATENT DOCUMENTS

| | | | |
|---|---|---|---|
| 3,903,404 | 9/1975 | Beall et al. | 364/708 |
| 4,152,750 | 5/1979 | Bremenour et al. | 361/393 |
| 4,227,094 | 10/1980 | Semur et al. | 361/394 |
| 4,247,882 | 1/1981 | Prager et al. | 361/395 |
| 4,454,569 | 6/1984 | Wunsch et al. | 364/900 |
| 4,490,775 | 12/1984 | Quan | 361/400 |
| 4,503,484 | 3/1985 | Moxon | 361/394 |
| 4,579,310 | 4/1986 | Wells et al. | 248/544 |
| 4,658,375 | 4/1987 | Onogi et al. | 364/709 |
| 4,672,511 | 6/1987 | Meusel et al. | 361/380 |
| 4,679,121 | 7/1987 | Schomers et al. | 361/393 |

OTHER PUBLICATIONS

Panduit Plastic Wiring Duct—advertisement—the publication date of this date of this advertisement is unknown, but the applicant assumes it to be prior art. (pp. 3 through 5).

Primary Examiner—Gary V. Harkcom
Assistant Examiner—Dale M. Shaw
Attorney, Agent, or Firm—Gregor N. Neff

[57] ABSTRACT

The computer terminal controller makes it possible to operate a relatively large number of input-output terminals with a single mainframe computer. The controller has a basic configuration enabling it to control up to sixteen terminals. However, the user easily can increase its capacity by adding one or more expansion modules, each module consisting of a cable connector panel and a printed circuit card. Precise locating pins and support structure and hand-operable fasteners are used to mount the panel so that no tools or special skills are needed. Each circuit card preferably contains sufficient circuitry to handle a specific number of additional input-/output terminals, and the panel has the same number of cable connectors. The card and the panel are connected to one another by simply plugging them together. The card is guided accurately into engagement with the panel by card guides. A comb-like cable holder structure is provided with flexible arms forming cable enclosures for holding and guiding the cables neatly and compactly within and into and out of the housing of the controller.

19 Claims, 4 Drawing Sheets

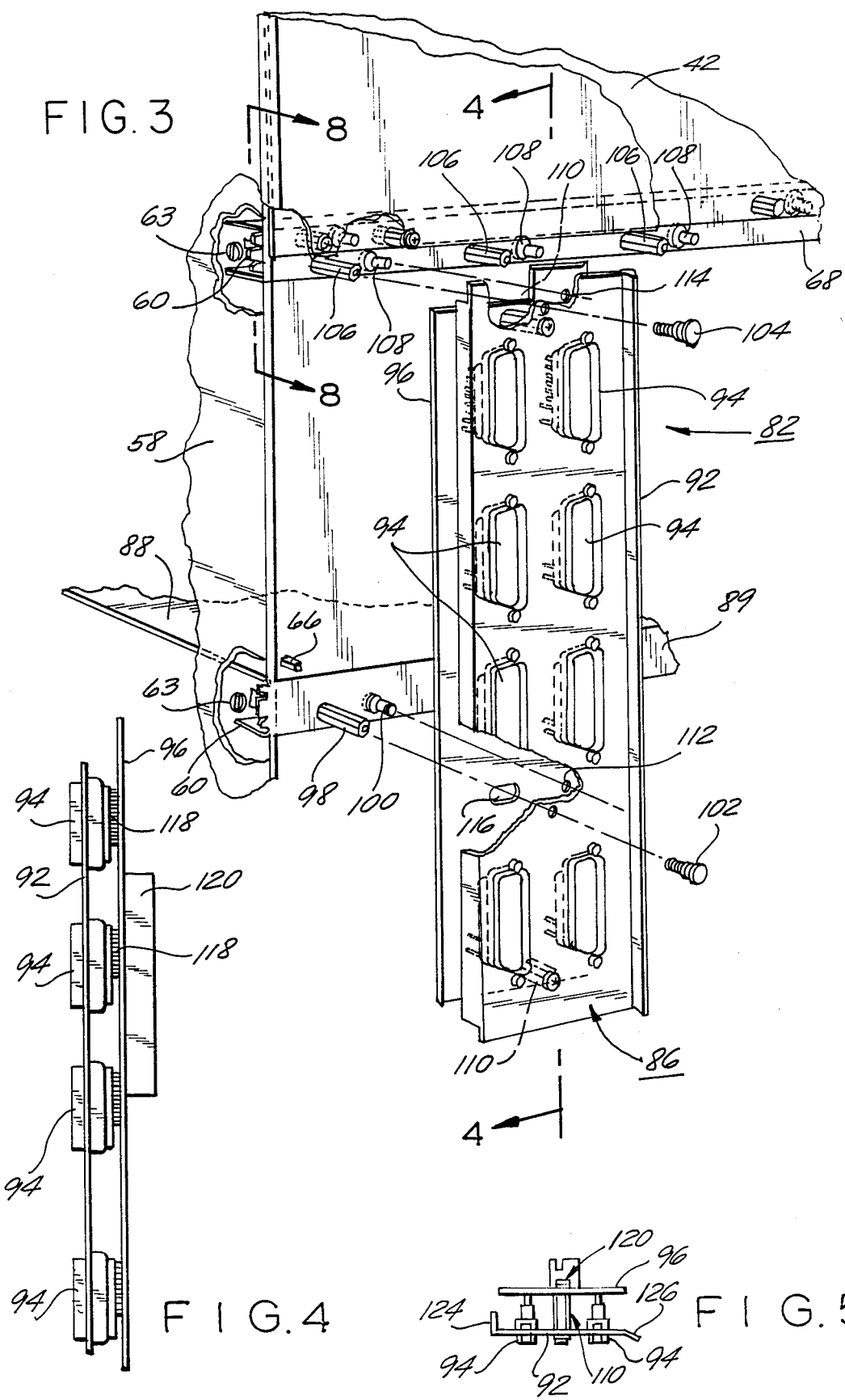

COMPUTER TERMINAL CONTROLLER AND METHOD

This invention relates to general purpose digital computers and to means and methods for enabling a plurality of input-output ("I/O") devices or terminals to be used with the computer.

It is highly desirable to maximize the utilization of all computers, and especially high-speed "mainframe" digital computers. To this end, computer terminal controllers have been provided for enabling a substantial number of I/O terminals to operate the computer simultaneously. However, with most such controllers, the user has been required to purchase equipment which has a capacity to handle far more terminals than he is ready to use with the computer. Thus, he makes a substantial capital investment in purchasing equipment which he does not need at the time, and may never need.

Accordingly, it is one object of the present invention to provide a computer terminal controller and method in which the basic controller is of relatively low capacity and thus is relatively inexpensive, but whose capacity can be expanded relatively easily by the owner, without the use of special tools or skills so as to enable the controller to handle a greatly increased number of I/O terminals, as the need arises.

Accurately aligning connectors with circuit boards without undue expense is a problem in computers and many other types of electrical equipment. Accordingly, it is another object of the invention to provide a relatively inexpensive and simple structure and method for this purpose.

In accordance with the invention, means are provided for easily and precisely mounting one or more panels containing cable connectors in a housing of the equipment. Also provided is a means for easily mounting a circuit element or board in alignment with the panel. Preferably, when used in a terminal controller, each circuit element contains a substantial amount of the circuitry need to control several I/O devices. The panel containing connectors and the circuit board are simply plugged together so that an increase in capacity of the equipment can be provided by the user without any special tools or skills. Thus, the user need not pay for unneeded extra capacity when the equipment is first purchased, but can enlarge the capacity quickly and easily and without high labor costs by buying an expansion module consisting essentially of a cable connector panel and a circuit board and simply installing them in the machine himself. Highly-trained computer service personnel need not be used.

With most computer equipment, keeping the connection cables neat and traceable is a difficult problem. In a terminal controller which has many computer cables entering and leaving the housing, the cables are especially difficult to keep separated and in neat groups, and can be difficult to trace. Therefore, it is another object of the invention to provide a cable holder which is relatively simple, sturdy, inexpensive and easy to use.

In accordance with this further object of the invention there is provided a comb-like structure with re-entrant flexible arms which form enclosures with restricted inlet openings into which the cables can be inserted. The cable openings preferably are aligned with groups of I/O connectors so that the cables take the most direct path to the cable holder. Preferably, an opening is provided in the bottom wall of the controller housing through which the cables exit the housing, and the cable holder is mounted near that opening.

Alternatively, or additionally, the rear panel of the terminal controller housing has a hinged lower portion which can be pivoted upwardly to allow cables to enter or exit the housing. Preferably the cable holder is positioned so as to hold the cable as it leaves either of the two openings.

The foregoing and other objects and advantages of the invention will be pointed out in or apparent from the following description and drawings.

In the drawings:

FIG. 3 is an exploded view of a sub-assembly of the device shown in FIGS. 1 and 2;

FIG. 4 is a cross-sectional view taken along line 4—4 of FIG. 3;

FIG. 5 is a top plan view of the structure shown in FIGS. 3 and 4;

GENERAL DESCRIPTION

Figure 1:
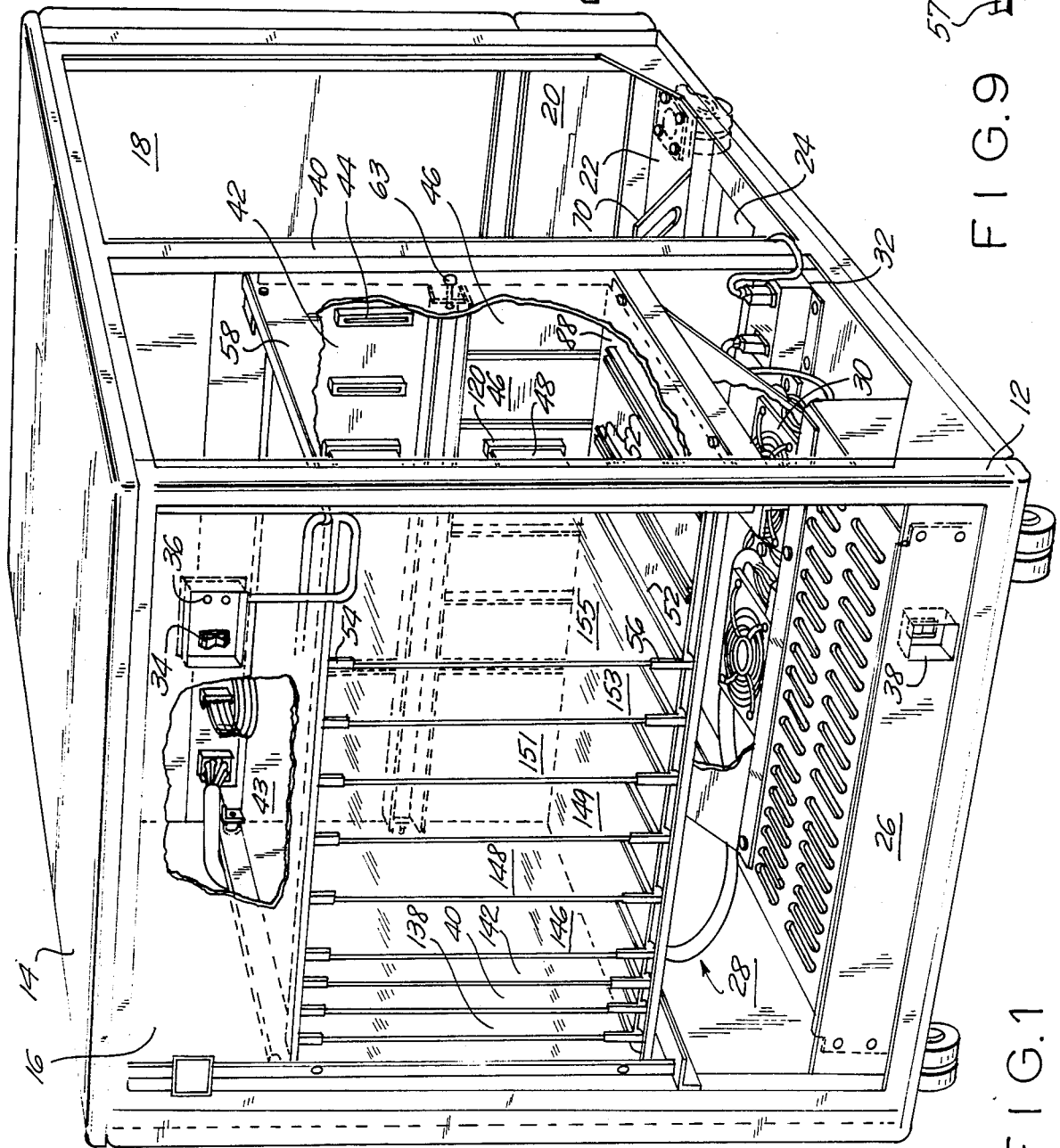
FIG. 1 is a front perspective view of a terminal controller constructed in accordance with the present invention, with parts broken-away and with the covers shown in phantom to show the internal structural features of the controller.
Figure 2:
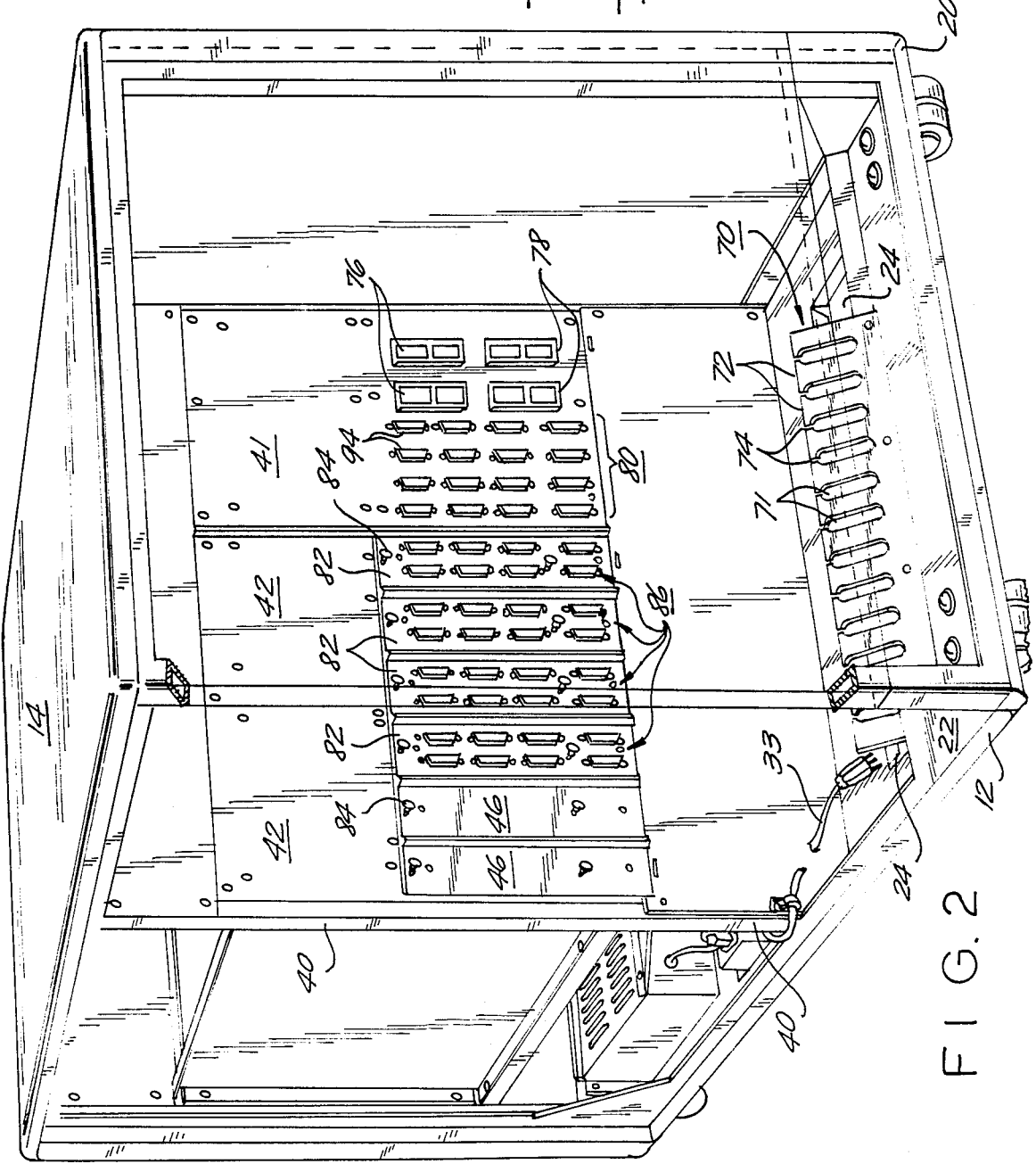
FIG. 2 is a rear perspective view, of the same type as FIG. 1, of the controller of FIG. 1.
Figure 7:
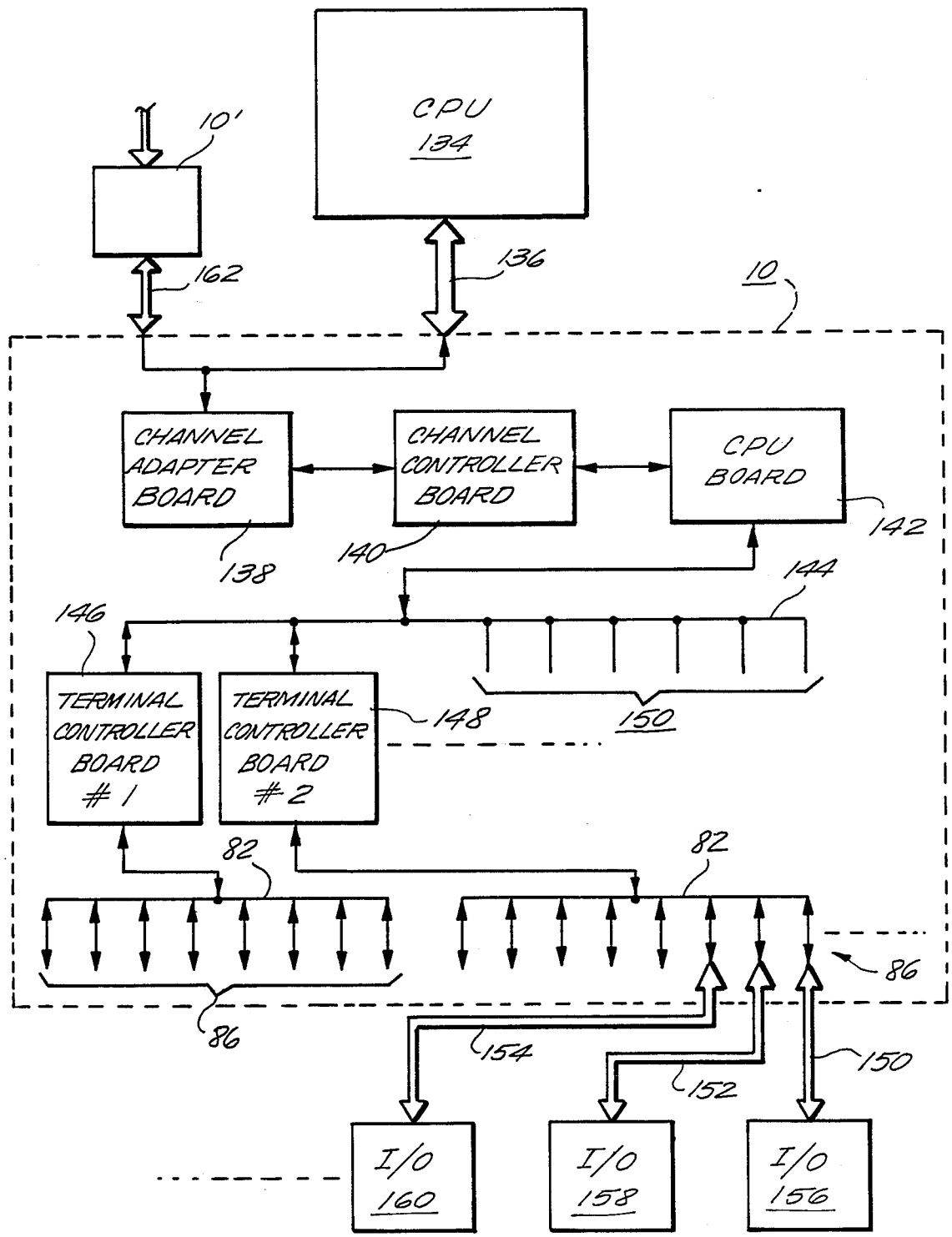
FIG. 7 is a schematic circuit diagram of the terminal controller of FIGS. 1-6 and the equipment it controls.

The terminal controller unit 10 is shown in perspective in FIGS. 1 and 2, and is indicated in dashed outline by the reference numeral 10 in FIG. 7.

Referring first to FIG. 7, the terminal controller 10 is connected between the central processing unit ("CPU") 134 of a general purpose digital computer and a plurality of input/output ("I/O") devices or terminals 156, 158, 160, etc.

The computer preferably is a "mainframe" computer such as the IBM model 370-4331 or -4341 computer, which is a relatively high-speed, powerful computer.

The I/O devices or terminals may be any of a wide variety of devices available today for data input to and output from digital computers. Such devices can include keyboards, video screens, tape decks, disc files, etc. The terminals can either be "dumb" or "smart"; that is, the terminals can have their own internal computing and storage capabilities, or they need not have such capabilities. For example, the terminals can be "personal computers".

As it will be explained in greater detail below, the terminal controller 10 permits the simultaneous connection and use of up to sixty-four I/O terminals with the computer CPU 134.

The basic function of the terminal controller 10 is a multiplexing function; that is, the terminal controller 10 transmits information between the CPU 134 and each of the individual I/O terminals by briefly enabling a communication link between each of the I/O devices and the CPU in sequence. This is done repeatedly at a high frequency.

Depending upon its programming, the controller 10 can give one of the terminals priority over the others, or it can treat all of the terminals equally, and can enable the communication links in a wide variety of predetermined patterns. The circuitry and programming for doing this is well known in the art and will not be discussed in detail here.

Still referring to FIG. 7, the circuitry of the terminal controller 10 advantageously is arranged on separate printed circuit boards 138, 140, 142, 146, 148, etc.

THe CPU is connected through a cable 136 to a channel adapter board 138. The circuitry on the channel adapter board 138 forms the interface between the controller 10 and the CPU 134; it converts high-speed serial data received from the CPU into eight-bit parallel data for use in the controller. Similarly, when conveying signals from the I/O terminals to the CPU, it converts eight bit parallel signals into high-speed serial signals to send to the CPU.

The channel controller board 140, which receives the output from the board 138, performs timing functions and determines when data is to be sent to and from the terminals and the CPU.

The CPU board 142, which is connected to the board 140, has microprocessors with programming which determines the priorities to be used in enabling communications with the terminals, provides some buffer storage to facilitate data transfer to and from the terminals and the CPU, and basically controls the multiplexing function.

Boards 146 and 148 are terminal controller boards and are identical to one another. They are connected by a common input line 144. Boards 146 and 148 are only two of the up to eight terminal controller boards which can be used in the machine at any one time. Each of the other boards, if used, would be attached by one of the lines 150 to the line 144.

Each terminal controller board 146, 148, etc. contains a microprocessor controller, RAM storage and ROM storage for the controller, and eight "UART" (Universal Asynchronus Receiver Transmitter) devices to communicate with up to eight I/O terminals. As it is well known, the UART devices convert parallel data from within the controller 10 to serial form to be sent to the terminals, and convert serial data from the terminals into parallel form needed by the controller cirguitry.

Each of the terminal controller boards 146, 148, etc. is connected to a I/O connector panel 82 which has an array 86 of cable connectors to which cables 150, 152, 154, etc. are connected to communicate with the I/O devices 156, 158 and 160, etc., respectively.

In accordance with one aspect of the invention, a substantial portion of the circuitry needed to control eight terminals is located on each of the terminal controller boards. An expansion module consisting of one terminal controller board and one of the panels 82 is provided. The board and the panel are made easy to mount and install in the controller to increase the number of I/O terminals which can be serviced by it. The basic controller includes at least the two boards 146 and 148 so as to provide a basic capacity for controlling up to sixteen terminals. Then, as needed, up to six expansion modules can be added, to provide a total capacity for controlling sixty-four terminals. By connecting up to three more terminal controllers such as 10' in parallel to the controller 10, by way of cables 162, 162[1], etc., the capacity can be increased to 256 terminals.

GENERAL MECHANICAL STRUCTURE

FIG. 1 is a front perspective view, partially broken-away, of the terminal controller unit 10. The unit includes a frame 12, a top wall 14, a front wall 16, a rear wall 18 with a hinged lower portion 20, and a bottom wall 22 with a cable outlet opening 24. The front door and right side wall of the unit have been drawn as if they were transparent in order to show the internal construction of the controller. Certain internal walls also have been broken-away, for the same purpose.

The unit 10 includes a power supply 26, a card cage section 28, cooling fans 30 and a junction box 32 to which a power supply cord 33 (FIG. 2) is connected as shown.

A power on/off switch 38 is provided at the front of the power supply section 26, and a switch 34 with indicator lights 36 is provided to connect the unit "on line". Centrally-located vertical frame members 40 (only one of which is shown in the drawings) at opposite sides of the housing support, the walls of the card cage 28 and the housing walls. A plurality of connection panels form the back wall of the card cage. The panels include a main panel 41, upper panels 42, I/O connector panels 82, and blank panels 46.

Returning to FIG. 1, the circuit boards 138, 140, 142, 146 and 148 are shown in place in the card cage 28. In addition, two further terminal controller boards 149 and 151 are shown. The various circuit boards are connected to the others and to the input and output connectors by means of edge connectors at the rear edges of the boards. In particular, plugs 44 mate with matching receptacles 50 on the upper edge portions of the terminal controller boards 146, 148, 149 and 151. Printed circuitry on the panel 42 provides interconnection such as the line 144 shown in FIG. 7. Similarly, a plug 120 on the rear of each of the panels 82 mates with a receptacle 48 on the lower rear edge portion of each of the terminal controller boards to electrically connect the boards to the connectors on the panels.

Each board slides in card tracks 52 at the top and bottom of the card cage. Each card is locked in place by means of latches 54 and 56.

A channel-shaped tie-bar 68 (FIG. 1) and the channel-shaped rear edge 80 (FIG. 3) of the metal shelf 88 forming the bottom of the card cage 28 serve as support members for the connector panels 41, 42, 82, etc.

FIXED CONNECTOR STRUCTURE

Referring to FIG. 2, the main connector panel 41 has a pair of cable connectors 76 for input and output connections to the CPU. It also has a pair of cable connectors 78 to receive the cable 162 (FIG. 7) for connecting to another terminal controller in series.

An array 80 of sixteen cable connectors for I/O terminals is provided on the panel 41. These connectors are provided as part of the basic equipment when it is sold. Each pair of columns of connectors 94 is connected to one of the terminal controller boards 146 or 148, which also is provided as a part of the basic machine. Thus, the machine has a basic capacity to control up to sixteen different terminals.

EXPANSION MODULES

As it has been described above in connection with FIG. 7, each of the panels 82 is provided as part of a module for use in expanding the capacity of the terminal controller. A module consists of the panel 82 and a terminal controller circuit board. The board and the panel 82 both are added to the machine at the same time in order to increase the capacity of the machine by up to eight additional terminals. Space for six of the panels 82 is provided, thus allowing the capacity of the machine to be expanded by a total of 48 terminals.

Referring now to FIG. 3, the construction and mounting of the panel 82 is illustrated in the exploded view of FIG. 3. Each panel 82 has a front wall 92 and a back wall 96. The cable connectors, which are, for example, of the RS 232 type, have pins 118 (FIG. 4) extending from the back. The connectors are mounted in holes in the front panel 92. The pins 118 are inserted into socket holes in the rear panel 96. The panel 96 is a printed circuit board, and selected ones of the holes into which the pins 118 are fitted are electrically connected to a plug member 120 mounted on the panel 96. Plug member 120 has a plurality of pins and is a commercially available connector member of the "MODU" style sold by Amp, Incorporated. It mates with a female receptacle member 48 (FIG. 1) attached to the rear edge of the terminal controller board 146, 148, etc.

PRECISION MOUNTING STRUCTURE

In accordance with another aspect of the invention, each of the panels 82 is made so that it can be easily mounted in the machine. For this purpose, a pair of alignment pins 100 and 108 (FIG. 3) is provided for each panel 82. The pin 100 is attached to the rear edge 89 of the bottom panel 88 of the card cage, and the upper pin 108 is attached to the tie-bar 68. These pins are located accurately with respect to one another. They fit into holes 112 and 114, respectively, in the rear wall 96 of the panel 82.

Insulating "stand-off" members 98 and 106 are attached adjacent the locating pins 100 and 108, respectively. The stand-off 98 extends through a hole 116 in the rear wall 96, and the stand-off 106 extends through a notch in the upper edge of the panel 96. Threaded fasteners 102 and 104 pass through holes in the front wall 92 and enter the threaded holes in the stand-offs 98 and 106 to secure the panel 82 in place. Preferably, each of the fasteners 102 and 104 has a relatively large knurled head which can be turned with the fingers or a pair of pliers so that no special tools are needed to mount the panels 82 in the unit. The hole 116 for the stand-off 98 is considerably larger than the diameter of the stand-off itself, so as to give the panel freedom to move in whatever direction the locating pins 100, 108 dictate.

As it is shown in FIG. 5, the left edge of the front panel 92 has an inwardly extending flange 124, and the right edge 126 is bent slightly outwardly so as to provide an overlap between adjacent panels to ensure that the metal panels will prevent the escape of radiation from the card cage. The blank metal panels 46 also are used as shielding.

The holes in which the locating pins are mounted are spaced accurately from one another, and maintained with accurate spacing over the life of the terminal controller, by means of an especially advantageous mounting structure.

Figure 8:
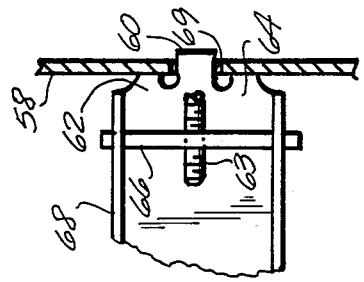
FIG. 8 is a cross-sectional view, partially broken-away, taken along line 8—8 of FIG. 3.
Figure 9:
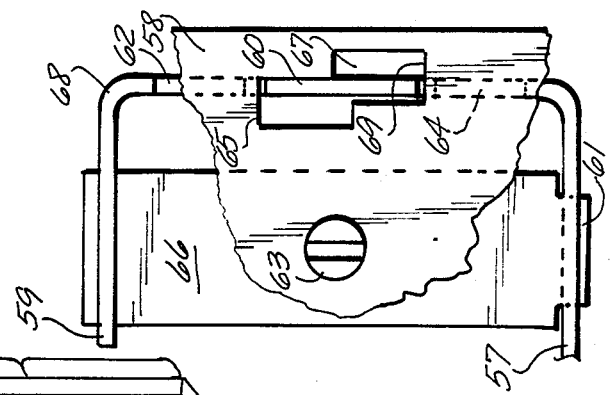
FIG. 9 is an enlarged front elevation view, partially broken-away, of the structure shown in FIG. 8.

Referring now to FIGS. 3, 8 and 9, each end of the tie-bar 68 and the rear edge channel 89 of the card cage bottom 88 has three projections or tabs 60, 62 and 64 (FIG. 8) extending from the end of the web of the channel. The central tab 60 is longer than the other two.

As it is shown best in FIG. 8, the central tab 60 extends through an opening in the sheet metal side-wall 58 of the card cage. The bottom edge of the tab 60 rests on the bottom edge 69 (FIG. 9) of the opening. The tie-bar 68 also is held in place by means of a fastener consisting of a metal plate 66 with a threaded hole and a screw 63. The screw 63 passes through a hole in the side-wall 58 and is threaded into the hole in the plate 66. The plate 66 passes through a slot in the top flange 59 of the channel member, and notches are cut in the lower corners to form a lower end portion 61 of reduced width. The portion 61 fits into a shorter slot in the bottom flange 57 of the channel. The plate 66 then rests on the shoulders created by the notches forming the end portion 61.

As it can be seen in FIG. 9, the opening in the wall 58 through which the tab 60 projects is formed by two rectangular holes 65 and 67 which are offset diagonally and which overlap one another. The opening thus formed permits the extremely accurate location of the lower edge 69 with respect to the lower edge of the hole below it into which fits the tab 60 for the edge 89 of the card cage bottom, and thus provides a means for accurately spacing the tabs 60 from one another.

Thus, both ends of the tie-bar 68 and the edge 89 (as well as other cross-members in the panel support structure) are supported on the card cage wall by the screws 63 and the tabs 60 and edges 69.

The opposite side-walls of the card cage are spaced accurately from one another by use of the projections 62 and 64, against which the walls bear. The projections 62 and 64 provide surfaces which can be shaped easily to provide an accurate locating surface. By use of this construction, the card guides can be accurately located with respect to the walls and the locating pins for the panels 82 so that the panels and card guides can be plugged together without the use of special alignment techniques or tools.

In accordance with another feature of the invention, the location pins 100, 108, etc., for the panels 82 and other panels, are located accurately with respect to the lower edges of the tabs 60, thus accurately locating the pins 100 and 108 with respect to one another. This is accomplished by the following manufacturing procedure. The card cage bottom wall 88 and the tie-bar 68 (as well as other cross-members not shown) are made of flat sheet metal. The holes for locating the pins 100, 108 and the notches to form the projections at the ends of the cross-members are punched on a numerically-controlled automatic punch press which locates the notches and holes precisely with respect to one another. Then, after all of the holes and notches have been cut, the sheet metal is bent to form the channel shapes shown. By this method, the inaccuracies which might be caused by bending the metal first are avoided; the accurate location of the tabs and pin holes is assured despite the inaccuracy of the bending process.

Figure 6:
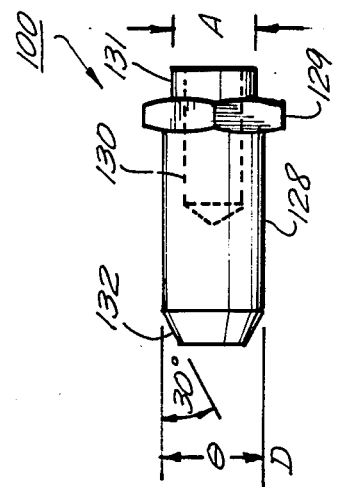
FIG. 6 is an enlarged view of a portion of the structure shown in FIGS. 1-5.

The locating pin 100 is shown in detail and enlarged in FIG. 6. All of the other locating pins are identical to it.

The pin has a shank 128 with a threaded hole 130 in its right end, and a bevel 132 at its left end. The angle $\theta$ of the bevel is approximately 30° C. The locating pin has a hexagonal wrench-engaging flange 129 near the right end. A short mounting shank portion 131 at the right end is provided. The diameter D of the shank 128 is determined within close tolerances, e.g., plus or minus 0.001 inch. Similarly, the diameter A of the shank portion 131 is determined with close tolerances, such as plus 0 and minus 0.002 inch. The mounting hole in the tie-bar 68 or member 89 in which the pin is mounted, and the holes 112 and 114 in the rear panels are dimensioned with similarly close tolerances. A screw (not shown) is threaded into the hole 130 in the pin 100 to fasten it in place.

The bevels 132 on the locating pins (FIG. 6) will enable one to press the panels 82 onto the pins and correct any slight misalignments which might exist.

Thus, a precise locating system is provided to enable the user to mount the panels 82 accurately so that they will be in accurate alignment with the card tracks 52 into which the cards are fitted. Thus, the male and female connectors 120 and 48 will be properly aligned and fit together easily.

CABLE HOLDER

In accordance with one aspect of the invention, a comb-like cable holding structure 70 (see FIG. 2) is mounted near the cable outlet opening 24. The structure 70 has a plurality of openings or slots 71 formed by flexible arms or teeth 72 which are wider at the top than in the middle so as to form restricted entrance slots or openings 74 to cable holding slots 71. The cable holding structure preferably is made out of flexible plastic such as "ABS" thermoplastic resin. Each of the holes or slots 71 is aligned with one or more vertical columns of cable connectors 80 and 86 on the panels 82 and 41 so that cables connected to a column of connectors can be aligned in a single slot, thus providing better traceability of the cables. Cables can be inserted into the slots 71 easily by merely bending adjacent arms 72 away from one another to widen the entrance 74 temporarily. The resilience of the arms causes them to return to the position shown in the drawings so as to retain the cables in the slots 71 and keep them neat and orderly.

As it can be seen in FIG. 2, the comb-shaped array 70 is mounted adjacent the outlet opening 24 in the bottom wall 22 of the housing, so as to easily guide the cables into and out of the housing. The holder 70 is inclined at an angle of approximately 45° C. with respect to the bottom of the housing.

The lower portion 20 of the rear panel of the housing is hinged at the top so that it can swing upwardly to allow egress of the cables through the opening thus formed in addition to or instead of the opening 24 in the bottom of the housing. The holder 70 is near and parallel to the opening thus formed, as well as the opening 24, and is positioned to guide and hold cables from either or both openings.

It is readily apparent that the invention meets the objectives set forth above. The terminal controller can be provided in a basic configuration with a limited capacity at a relatively modest price. Then, as the user's need for terminals grows with the growth of his business and/or computer usage, he can add capacity by obtaining expansion modules, each consisting of a terminal controller board and a panel 82, and adding one or more of them. This is done by merely removing one or more of the blank panels 46 and replacing it with a terminal panel 82 by use of the thumb screws, and by sliding the terminal controller board 82 into place. By this means, the capital expenditure that otherwise would be required for purchase of a machine with larger capacity is avoided.

Subsequently, when one terminal controller is completely occupied, additional terminal controllers can be added in parallel, up to four or more in number, to even further increase the capacity of the system.

The cable holder with comb-like construction provides a very simple and effective way of keeping cables separated and aligned properly.

The above description of the invention is intended to be illustrative and not limiting. Various changes or modifications in the embodiments described may occur to those skilled in the art and these can be made without departing from the spirit or scope of the invention.

Moreover, the utility of the invention outside of the specific environment of a terminal controller must be recognized. Some of the features of the invention are useful in other types of computer equipment or in other equipment, and the utilization of the invention in those other environments is contemplated herein. Also, the invention is not limited to use in a stand-alone machine, but can be included in standard computer housings, etc., and in a variety of combinations.

We claim:

1. In a controller device for controlling the transmission of signals between a plurality of input-output ("I/O") terminal devices and a central processing unit ("CPU"), said controller device including a housing, and multiplexing means mounted in said housing for sequentially conducting signals between each of said I/O terminal devices and said CPU, the improvement consisting of a panel which mounts easily on said controller device, a plurality of I/O device connectors mounted on said panel, coupling means in said housing for connecting said I/O device connectors to said multiplexing means, a circuit card holder for holding a circuit card bearing a portion of the circuitry of said multiplexing means needed for adding the I/O device connectors on said panel to said controller device, means for mounting said panel in said housing in alignment with said card holder, and plug coupling means for electrically connecting said circuit card to said panel.

2. A device as in claim 1 in which said housing has a frame, said mounting means includes a pair of spaced apart alignment pins, each being mounted on one of said frame and said panel, and a pair of mating holes for receiving said pins with close tolerances, each of said holes being located on the other of said frame and said panel with a spacing matching that of said pins.

3. A device as in claim 2 including a threaded fastener with gripping means to permit tightening with the fingers and a threaded hole in said frame for receiving said threaded fastener to secure said panel to said frame.

4. A device as in claim 1 in which said I/O connectors have connecting pins, a coupling circuit board with socket holes, said pins being located in said holes, said plug coupling means comprising a socket and plug combination, connected between said coupling circuit board and the edge of said circuit card.

5. A device as in claim 1 including a cable holder comprising a base, a comb-like array of flexible projections from said base, each forming an encircling cable guide with a restricted entrance/exit opening, said housing having a cable outlet opening, said cable holder being mounted in said housing adjacent said cable outlet opening.

6. A device as in claim 1 in which the number of I/O device connectors on said panel and the amount of circuitry on said card are matched so that the panel and card comprise a module which mounts easily in said housing to add I/O device capacity to said controller.

7. A controller device for controlling the transmission of signals between a plurality of input-output ("I/O") terminal devices and an central processing unit ("CPU"), said device comprising a housing, circuitry mounted in said housing for controlling the transmission of signals between said CPU and primary group of I/O terminal connectors, and receptacles for receiving and mounting in said housing a plurality of circuit members, the improvement in which each circuit member bears an amount of circuitry sufficient for controlling the transmission of signals between said CFU and a connector panel bearing a pre-determined number of I/O terminal connectors, and a plurality of panel mounting structures for easily and accurately aligning said connector panel with one of said circuit members, whereby one of said panels and one of said circuit members can be added and connected together in order to expand the number of I/O terminals which can be controlled by said controller device.

8. A device as in claim 7 in which the amount of circuitry on each of said circuit members is pre-determined so as to control transmission with a number of I/O devices equal to the number of connectors on one panel.

9. A device as in claim 8 in which each of said mounting structures includes a pair of accurately spaced locating pins adapted to fit into mating holes.

10. A device as in claim 9 in which each of said mounting structures includes a printed circuit card, a mounting guide aligned accurately with respect to said pins so as to bring a plug member on an edge of a card-form circuit member into engagement with a mating plug member on the rear of one of said panels to electrically couple the card and connectors on the panel together.

11. A device as in claim 9 including thumb-screw threaded fastener means for attaching said panel to said housing with said pins in said holes.

12. A device as in claim 9 in which said housing includes rigid horizontal support members spaced apart from one another, one of said pins being located on one of said horizontal support members and the other of said pins of the other of said horizontal support members, said walls having accurately spaced apart openings, each of said horizontal members having a projection extending into one of said openings and resting on the lower edge of that opening, said projection being accurately located relative to said locating pin.

13. A device as in claim 9 in which each of said receptacles comprises a pair of printed circuit board guides through which said circuit board slides to connect with said connector panel, said connector panel comprises an elongated member, said spaced holes being located on said elongated member, said pins being mounted and vertically spaced apart on said housing, and including hand-operated thread fastener means for fastening said panel to said housing with said pins and holes engaged, said panel being precisely located in alignment with said circuit board guides.

14. An expandable structure for connecting peripheral devices to a computer, said structure comprising a basic group of terminal connectors for said peripheral devices, circuit member receptacle means for receiving and holding a plurality of expansion circuit members, a plurality of panel mounting means for mounting each of a plurality of terminal connector panels in alignment with one of said circuit members, said panel mounting means comprising accurately spaced locating pins and holes and fastening means for fastening each of said panels with said pins inserted into said holes and for holding one of said circuit members in contact with one of said panels.

15. A structure as in claim 14, including a housing, and in which said housing includes rigid horizontal support members spaced apart from one another, one of said pins being located on one of said horizontal support members and the other of said pins on the other of said horizontal support members, said walls having accurately spaced apart openings, each of said horizontal members having a projection extending into one of said openings and resting on the lower edge of that opening, said projection being accurately located relative to said lcoating pin.

16. A structure as in claim 15 in which each of said receptacles comprises a pair of printed circuit board guides for slidably receiving a vertical printed circuit board, said connector panel comprises an elongated member, said spaced holes being located on said elongated member, said pins being mounted and vertically spaced apart on said housing, and including hand-operable threaded fastener means for fastening said panel to said housing with said pins and holes engaged, said panel being precisely located in alignment with said circuit board guides.

17. A method of increasing the number of input-output ("I/O") terminals to be connected to a central processing unit ("CPU") of a computer by the use of a terminal controller unit having a primary group of connectors for connecting to I/O devices, and means for controlling the transmission of signals between said I/O devices and said CPU, said method comprising the steps of
providing at least one expansion module comprising a circuit member bearing an amount of circuitry sufficient to enable another group of connectors for connecting to I/O devices, a support member bearing said other group of connectors, and means for electrically connecting the support and circuit members together,
providing accurate locating means for locating said support member and said circuit member with respect to one another on a support structure, and
mounting said support member and circuit member on said support structure and electrically connecting them together to expand the number of I/O devices to be connected to said CPU.

18. A method as in claim 17 in which said amount of circuitry on said circuit member is exactly matched to the number of connectors in said other group.

19. A method for making an expandable computer peripheral terminal connection structure, the steps of
providing a circuit card cage with a plurality of card holders, mounting means for accurately mounting each of a plurality of terminal connector-bearing panels in alignment with said card holders, said mounting means including locating members for accurately locating said panels on a support structure,
forming accurately-located end support holes in sheet metal housing walls to support the ends of transverse elongated angular support members,
accurately locating locator holes for said locating members relative to the ends of further metal sheets,
bending said further metal sheets to form said angular support members, and
assembling said support members with the ends in said end support holes.

* * * * *